US006570162B2

(12) United States Patent
Kiga et al.

(10) Patent No.: US 6,570,162 B2
(45) Date of Patent: May 27, 2003

(54) METHOD AND APPARATUS FOR ELECTRON BEAM IRRADIATION

(75) Inventors: Masahiro Kiga, Tokyo (JP); Atsushi Nakamura, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/926,744

(22) PCT Filed: Apr. 12, 2001

(86) PCT No.: PCT/JP01/03150

§ 371 (c)(1),
(2), (4) Date: Dec. 11, 2001

(87) PCT Pub. No.: WO01/80279

PCT Pub. Date: Oct. 25, 2001

(65) Prior Publication Data

US 2002/0134946 A1 Sep. 26, 2002

(30) Foreign Application Priority Data

Apr. 13, 2000 (JP) ....................................... 2000-112588
May 11, 2000 (JP) ....................................... 2000-138845

(51) Int. Cl.[7] ................................................ H01J 37/10
(52) U.S. Cl. ............................... 250/396 R; 250/492.3
(58) Field of Search .......................... 250/396 R, 492.3, 250/492.1, 492.2, 310, 311, 306, 307

(56) References Cited

U.S. PATENT DOCUMENTS 3,710,017 A * 1/1973 Abe ........................... 178/6.8
4,396,841 A 8/1983 Razin et al.

FOREIGN PATENT DOCUMENTS

DE 2 040 158 2/1971

OTHER PUBLICATIONS

European Patent Office—Patent Abstracts of Japan, Publication No. 07320680, dated Dec. 8, 1995.

* cited by examiner

*Primary Examiner*—Kiet T. Nguyen
(74) *Attorney, Agent, or Firm*—Armstrong, Westerman & Hattori, LLP

(57) ABSTRACT

A method and apparatus (11) for irradiating an electron beam, wherein a triangular wave generator (22) provides a triangular wave current to a scanning coil (17) to move the electron beam in a first scanning direction (Y), while a square wave generator (21) provides a square wave current to a deflecting coil (16) to move the electron beam in a second scanning direction (X) orthogonal to the first scanning direction (Y). The triangular wave current provided from the triangular wave generator is modulated to cancel the effects of hysteresis in the scanning coil. Further, the rise of the square wave current is synchronized and shifted a prescribed interval in relation to the peak values of the triangular wave current in order to distribute the reversing points on the electron beam path along the second scanning direction.

10 Claims, 7 Drawing Sheets

F I G. 6A
F I G. 6B
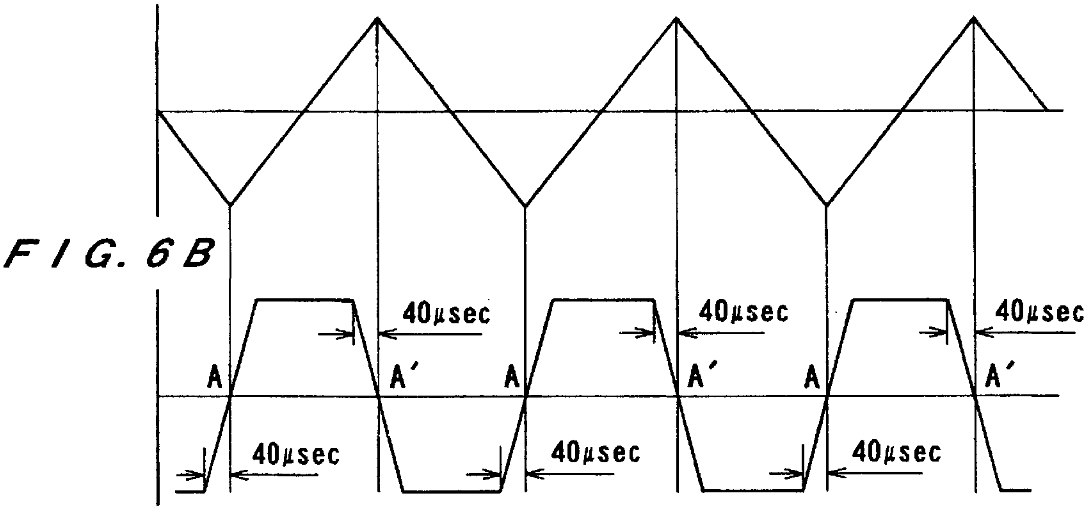
F I G. 7
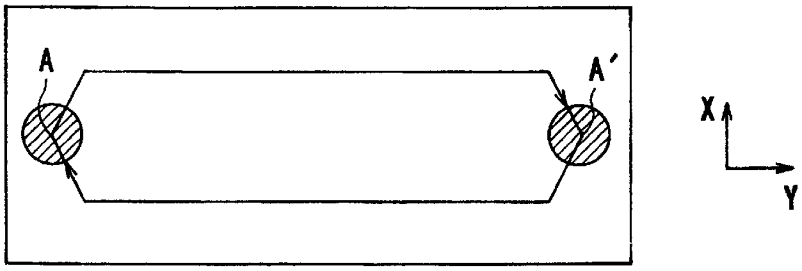

METHOD AND APPARATUS FOR ELECTRON BEAM IRRADIATION

TECHNICAL FIELD

The present invention relates to an electron beam irradiating apparatus used for processing exhaust gas and the like discharged from a thermal power plant, for example, or an electron beam irradiating apparatus for large current irradiation used to refine the quality of substances such as cross-linking of resins. The present invention particularly applies to a method and apparatus for irradiating an electron beam in which the electron beam is moved in a scanning motion while being emitted into the atmosphere through a window foil for ejecting electrons.

BACKGROUND ART

It is currently thought that SOx, NOx, and other components found in flue gas that is discharged from thermal power plants and the like is the cause of such global problems as global warming and acid rain that have been linked to air pollution. Methods of desulfurization and denitration remove these toxic components SOx, NOx, and the like through the irradiation of an electron beam on the flue gas are well known in the art.

FIG. 1 shows an example of an electron beam irradiating apparatus used for the above application. This device used for processing flue gas mainly comprises a power source 10 for generating a DC high voltage; an electron beam irradiating apparatus 11 for irradiating an electron beam on the flue gas; and a channel 19 through which the flue gas is transported. The channel 19 is disposed along a window foil 15 that serves as an outlet for the electron beam irradiated from the electron beam irradiating apparatus 11. The window foil 15 is formed of a thin plate constructed of titanium or the like. An electron beam emitted externally through the window foil 15 irradiates such molecules as oxygen ($O_2$) and water vapor ($H_2O$) in the flue gas. These molecules become such highly oxidative radicals as OH, O, and $HO_2$. These radicals oxidize the noxious components of SOx, NOx, and the like and generate the intermediate products of sulfuric acid and nitric acid. These intermediate products react with ammonia gas that has been introduced in advance to produce ammonium sulfate and ammonium nitrate, which can be recovered and used in fertilizer. Accordingly, this type of exhaust gas processing system can remove harmful components, such as SOx and NOx from the flue gas and can recover such useful materials as ammonium sulfate and ammonium nitrate as by-products.

The electron beam irradiating apparatus 11 comprises a thermionic generator 12 such as a thermionic filament; an accelerating tube for accelerating the electrons emitted from the thermionic generator 12; a deflecting coil 16 (electromagnet) for deflecting the electron beam in the widthwise direction by applying a magnetic field using a square wave current; and a scanning coil 17 (electromagnet) for moving the controlled electron beam in a lengthwise scanning direction by applying a magnetic field to the electron beam. Of these, the electron beam generator, accelerating electrode, and deflecting/scanning magnetic poles are accommodated in vacuum vessels 18*a* and 18*b* and maintained in a high vacuum atmosphere of approximately $10^{-6}$ Pa. By supplying an electric current to the deflecting coil 16 and scanning coil 17 and forming a magnetic field using the electromagnets, the high-energy electron beam is injected in a prescribed range through the window foil 15 onto a prescribed area of the channel 19, while deflecting the beam and moving the same in a scanning direction.

As described above, this type of electron beam irradiating apparatus must eject an electron beam highly accelerated in a vacuum environment into the atmosphere. Generally, in order to achieve a high electron transmission efficiency when ejecting an electron beam, a window foil formed of a pure titanium membrane or a titanium alloy membrane having a thickness of several tens of micrometers, for example 40 $\mu$m, is used. This window foil is mounted on the end of the vacuum vessel 18*a* via a mounting flange. The window foil is large, for example 3×0.6 meters. A pressure of approximately 1,000 hPa, which is atmospheric pressure, is applied to the outer surface of the window foil having an inner vacuum pressure in the vacuum vessel of $10^{-6}$ Pa.

Next, deflection and scanning of the electron beam will be described.

A triangular wave generator 22 supplies a triangular wave current as shown in FIG. 2A to the scanning coil 17 in order to move the electron beam to scan in the Y-direction shown in FIG. 3. A square wave generator 21 supplies a square wave current as shown in FIG. 2B that is synchronized to the triangular wave to the deflecting coil 16 in order to move the electron beam to scan in the X-direction orthogonal to the Y-direction shown in FIG. 3. As both coils 16 and 17 become excited by the currents, the electron beam is accelerated by an accelerating tube 13 and enters the deflection/scanning section to scan along a rectangular path as shown in FIG. 3. The electron beam passes through the window foil 15 and irradiates the target matter.

Here, the path Y1 shown in FIG. 3 is formed when the square wave current between times T1 and T2 in FIGS. 2A and 2B is fixed at +Q and while the current from the triangular wave generator changes from +P to −P. The path X1 is formed when the triangular wave current peaks at −P (time T2) and the square wave current changes instantaneously from +Q to −Q. Similarly, the path Y2 is formed when the triangular wave current changes from −P to +P between times T2 and T3, while the path X2 is formed at time T3, when the square wave current changes instantaneously from −Q to +Q.

FIG. 4 shows the magnetic hysteresis characteristics of the scanning coil 17. When the scanning coil 17 moves the electron beam in the scanning direction, the relationship between the current I and the magnetic flux density B of the scanning coil 17 has hysteresis characteristics at the reversing points in both Y-directions, or in terms of the scanning coil current, at the point of transition when the beam point on the triangular wave current begins to drop or rise. At these points, the flux density B cannot follow the current I, thereby slowing down the scanning rate of the electron beam. Hence, whenever the peak values (+P and −P) of the triangular wave current I enter the saturation region of the flux density B, the flux density B does not change even when the size of the current I changes, thereby causing the scanning rate of the electron beam to change. Accordingly, the amount of electron beam irradiation becomes uneven.

Referring back to the hysteresis characteristics of I and B in FIG. 4, the flux density B does not drop or rise in proportion to rises and falls in the current I, but rather remains relatively uniform for a short time. As a result, the electron beam stagnates during this period. Therefore, the dose at the starting points of each Y scan indicated with hatching in FIG. 3 is increased, causing a non-uniform distribution.

FIG. 5A is a graph plotting the distribution of electron dose along the Y-direction during this time. The graph shows the combined state of Y1 and Y2. As can be seen, there is an unbalanced amount of stress added to the window foil in the irradiating window. This stress causes the temperature at specific areas of the foil surface to rise abnormally, thereby further decreasing the life of the window foil. Further, a uniform electron beam is not applied to the targeted matter beneath the window foil.

Therefore, a method has been proposed for achieving uniformity in the electron irradiation dose that considers the hysteresis delay in the flux density during the drop of the triangular wave. This method performs irradiation with a delta function step (superimposing a kick pulse) near the peak of the triangular wave.

However, simply using a triangular wave with a superimposed kick pulse to even the electron dose does not cancel the non-uniformity of the electron beam dose near the starting points at both ends in the Y-direction. In actual measurements of the electron dose distribution for the electron beam scanning in the Y1 and Y2 directions, a slanted distribution is found, as shown in FIGS. 5B and 5C.

Another conventional method of deflecting and scanning an electron beam will be described with reference to FIGS. 6A and 6B. The triangular wave generator 22 supplies a triangular wave current, such as that shown in FIG. 6A to the scanning coil 17, causing the electron beam to scan in the lengthwise direction (Y-direction) shown in FIG. 7. The square wave generator 21, on the other hand, supplies a trapezoidal wave current, such as that shown in FIG. 6B, to the deflecting coil 16, causing the electron beam to scan in the widthwise direction (X-direction). The triangular wave current shown in FIG. 6A and the trapezoidal wave current shown in FIG. 6B are synchronized such that the peaks of the triangular waves coincide with the midpoints A and A' in the rise of the trapezoidal wave. Accordingly, the deflecting coil 16 and scanning coil 17 cause the electron beam to scan along an elongated hexagonal path, such as that shown in FIG. 7.

In this case, the electron beam is accelerated in the vacuum vessel and deflected to scan through the window foil and irradiate through the irradiation window onto the target matter in the air. However, energy is lost when the accelerated electron beam passes through the window foil, thereby heating the foil. If the beam is concentrated on one part of the window foil, the heat concentrated at that part could cause the foil to tear. Therefore, it is desirable to maintain a uniform heat density when conducting deflection and scanning of the electron beam. However, reversing points A and A' in the elongated hexagonal scanning path shown in FIG. 7 correspond to the end of scanning in the Y-direction at the midpoints of the rise of the trapezoidal wave current shown in FIG. 6B. As a result, the electron beam moves in the X-direction at points A and A', indicated by the hatching in FIG. 7, but turn back in the Y scanning direction. Hence, the movement of the electron beam stagnates in these areas, allowing heat to become concentrated on the window foil and making it possible for the foil to tear.

DISCLOSURE OF INVENTION

In view of the foregoing, it is an object of the present invention to provide a method and apparatus for electron beam irradiation capable of performing a uniform scan and avoiding the problems of hysteresis in the scanning coil when scanning the electron beam reciprocally in the lengthwise direction.

It is another object of the present invention to provide a method and apparatus for electron beam irradiation that is capable of avoiding heat concentration caused by the electron beam on the irradiation window.

These objects and others will be attained by an apparatus for irradiating an electron beam comprising a scanning coil; a triangular wave generator for providing a triangular wave current to the scanning coil to move the electron beam in a first scanning direction; a deflecting coil; a square wave generator for providing a square wave current to the deflecting coil to move the electron beam in a second scanning direction orthogonal to the first scanning direction; and a control unit for modulating the triangular wave current provided from the triangular wave generator for canceling the effects of hysteresis in the scanning coil.

Here, the control unit should modulate the triangular wave current to form steep slopes on the rise and fall of the waveform. Further, the waveform of the triangular wave current has a plurality of displacement points on both the rise and fall of the waveform to divide the rise and fall into a plurality of connected linear segments.

According to another aspect of the present invention, a method of irradiating an electron beam comprises the steps of generating a triangular wave current using a triangular wave generator; supplying the triangular wave current to a scanning coil to move the electron beam in a first scanning direction; generating a square wave current using a square wave generator; supplying the square wave current to a deflecting coil to move the electron beam in a second scanning direction orthogonal to the first scanning direction; and modulating the triangular wave current provided from the triangular wave generator using a control unit to cancel the effects of hysteresis in the scanning coil.

Here, the triangular wave current should be modulated to form steep slopes on the rise and fall of the waveform.

The present invention compensates for the relationship between the electric current and the flux density hysteresis in order to achieve a uniform irradiation dose for the triangular wave current used to scan the electron beam in the lengthwise direction. Because of the hysteresis characteristics, the flux density has almost no change in relation to changes in the current during the rise and fall points of the triangular wave current. By forming a steeper change in the electric current at these points, it is possible to avoid the effects of hysteresis and achieve an approximately linear change in flux density. By so doing, it is possible to maintain a substantially fixed scanning rate for the electron beam. The method of the present invention solves the problem in conventional apparatus in which the electron beam stagnates (the scanning rates slows) due to the hysteresis in the scanning coil. Therefore, it is possible to achieve a uniform dose distribution to prevent an unbalance in the dose applied to the window foil.

According to another aspect of the present invention, a method of irradiating an electron beam comprises the steps of generating a triangular wave current using a triangular wave generator; supplying the triangular wave current to a scanning coil to move the electron beam in a first scanning direction; generating a square wave current using a square wave generator; supplying the square wave current to a deflecting coil to move the electron beam in a second scanning direction orthogonal to the first scanning direction; and synchronizing the rise of the square wave current to be shifted a prescribed interval in relation to the peak values of the triangular wave current in order to distribute the reversing points on the electron beam path along the second scanning direction.

Here, the timing of the rise in the square wave current should be shifted each cycle to repeatedly alternate the position on the square wave in relation to a reference rising position in the order of a reference position, a delayed position, an advanced position, the reference position, the delayed position and so on. Further, the reversing point in the electron beam path is moved in order within about half the scanning width formed by the square wave current.

According to another aspect of the present invention, an apparatus for irradiating an electron beam comprises a scanning coil; a triangular wave generator for providing a triangular wave current to the scanning coil to move the electron beam in a first scanning direction; a deflecting coil; a square wave generator for providing a square wave current to the deflecting coil to move the electron beam in a second scanning direction orthogonal to the first scanning direction; and a controller for synchronizing the rise of the square wave current to be shifted a prescribed time interval in relation to the peak values of the triangular wave current to distribute reversing points on the electron beam path in a prescribed order along the second scanning direction.

With this construction, it is possible to spread the reversing positions at which points the electron beam is concentrated, thereby avoiding heat concentration on the window foil. In this way, the life of the window foil is lengthened, and the load placed on the device for cooling the window foil is reduced. As a result, this device can be made more compact. It is also possible to irradiate a uniform electron beam onto the target matter beneath the window foil to generate a homogeneous reaction with the target matter.

The above and other objects, features, and advantages of the present invention will become apparent from the following description when taken in conjunction with the accompanying drawings which illustrate preferred embodiments of the present invention by way of example.

BRIEF DESCRIPTION OF DRAWINGS

FIGS. 6A and 6B are graphs showing waveforms of a triangular wave current and a trapezoidal wave current, respectively, used in a conventional electron beam irradiating apparatus;

FIG. 7 is a plan view showing the path of the electron beam in a conventional electron beam irradiating apparatus;

BEST MODE FOR CARRYING OUT THE INVENTION

Figure 8A:
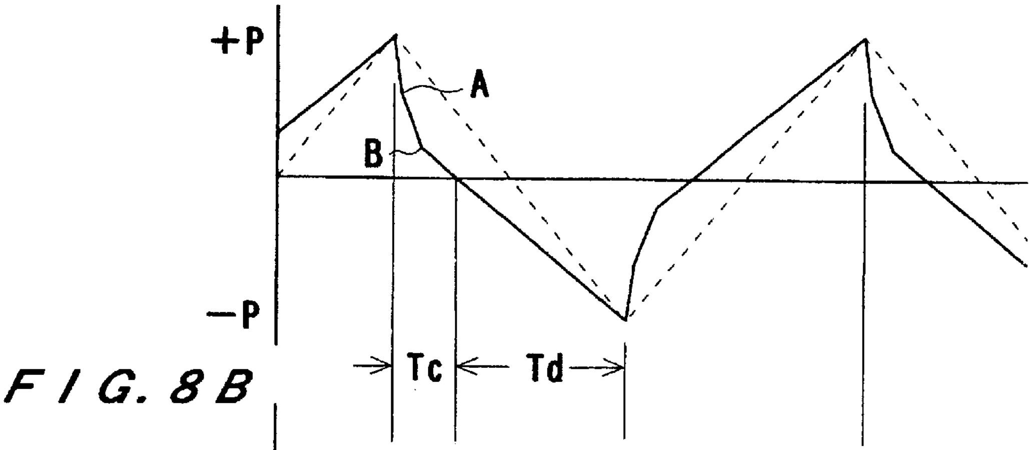
FIGS. 8A and 8B are graphs showing waveforms of a triangular wave current and a rectangular wave current, respectively, according to the first embodiment of the present invention.
Figure 8B:
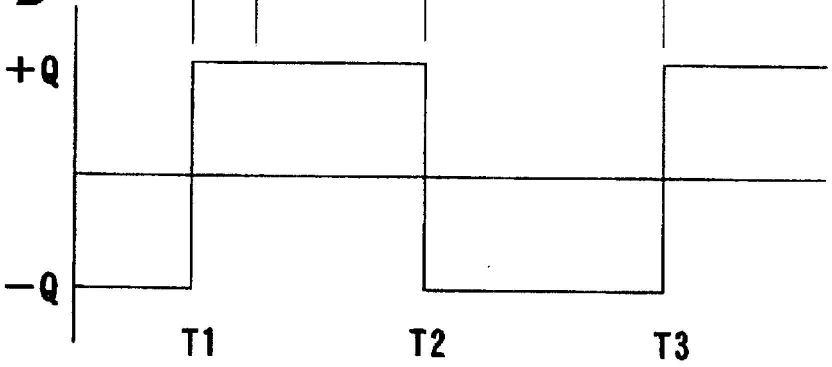

An electron beam irradiating apparatus according to preferred embodiments of the present invention will be described while referring to the accompanying drawings. An electron beam irradiating apparatus according to the first embodiment will be described with reference to FIGS. 8–10. FIG. 8A shows the waveform for a triangular wave current provided by a triangular wave generator of the present embodiment, while FIG. 8B shows the waveform for a square wave current provided by a square wave generator.

Figure 1:
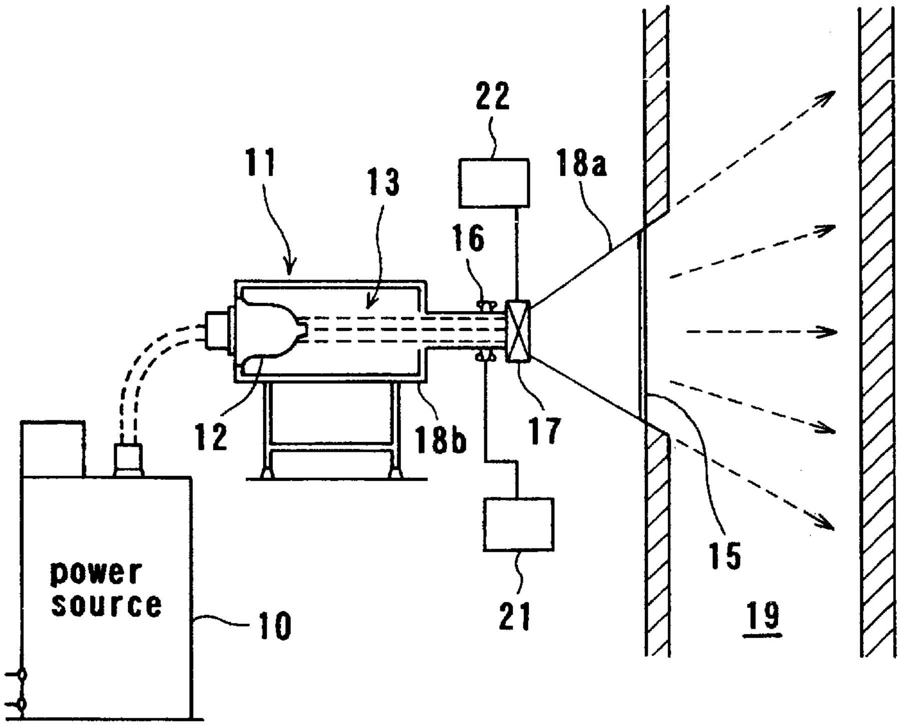
FIG. 1 is an explanatory diagram showing the general construction of an electron beam irradiating apparatus.
Figure 2A:
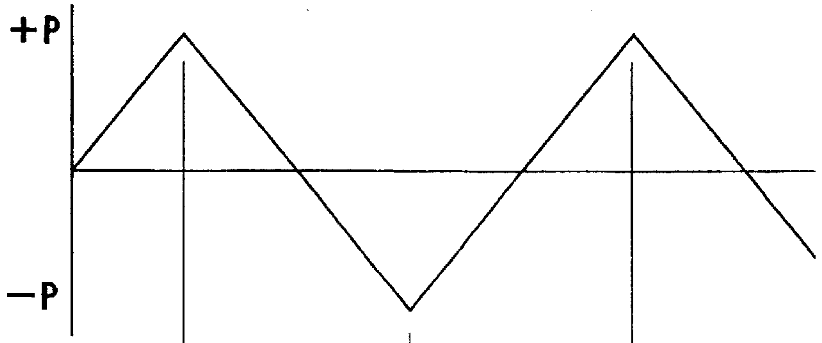
FIGS. 2A and 2B are graphs showing waveforms of a triangular wave current and a rectangular wave current, respectively, used in a conventional electron beam irradiating apparatus.
Figure 2B:
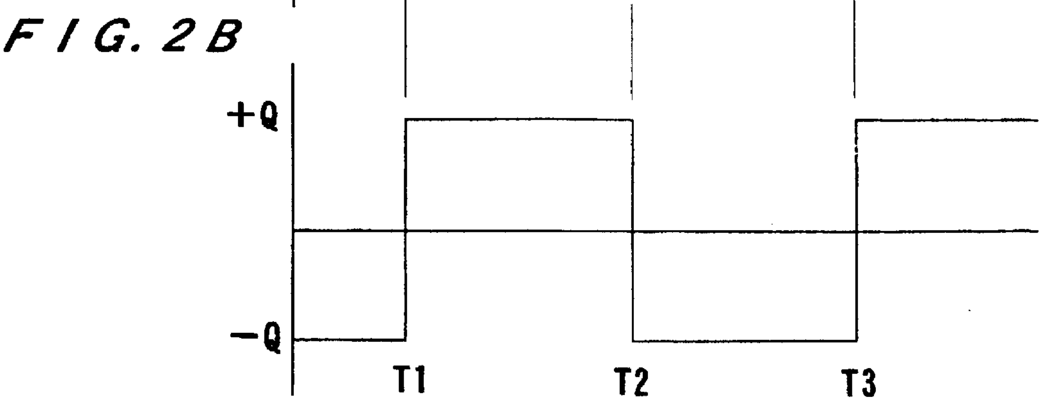
Figure 3:
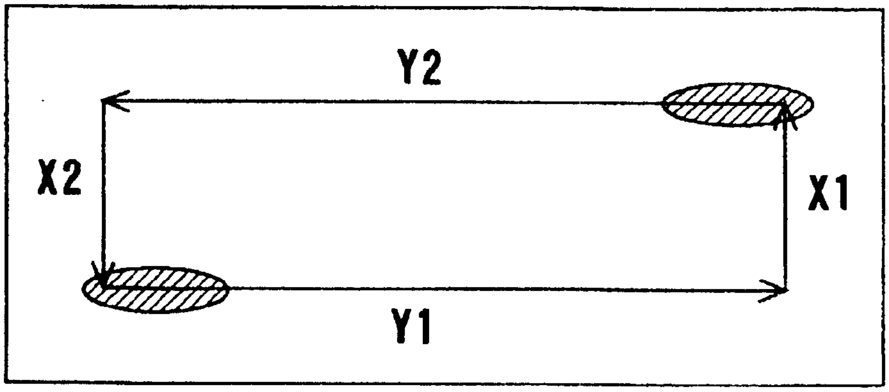
FIG. 3 is a plan view showing the path of the electron beam, the hatching indicating the areas in which the scanning speed slows.
Figure 4:
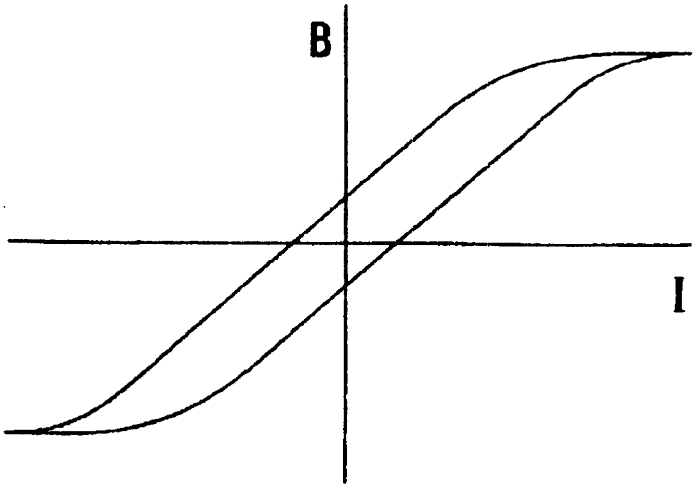
FIG. 4 is a graph showing an example of hysteresis characteristics for the scanning coil.
Figure 5A:
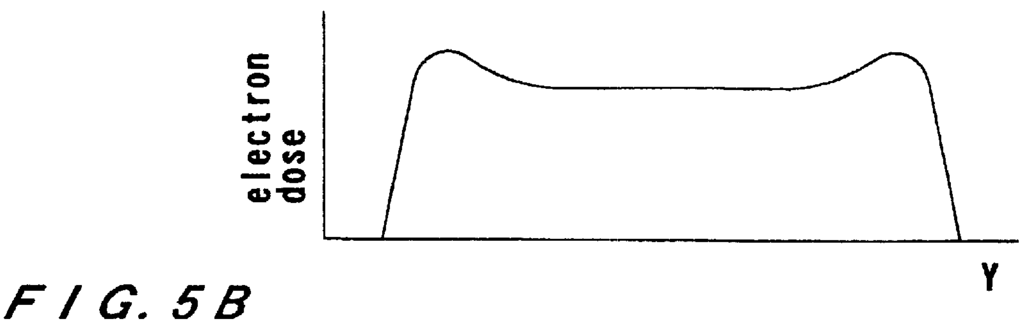
FIGS. 5A through 5C are graphs showing the dose distribution along the scanning path of a conventional electron beam irradiating apparatus.
Figure 5B:
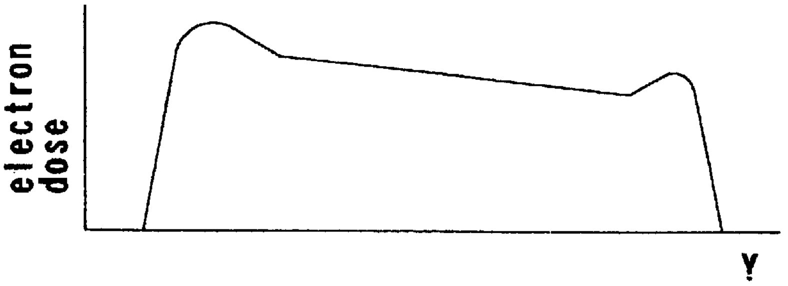
Figure 5C:
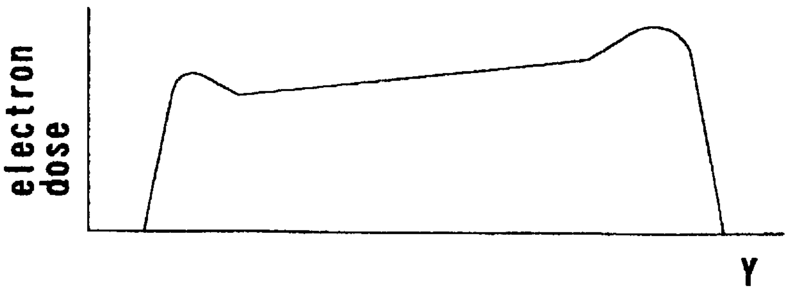

In the present embodiment, the waveform of a square wave current is the same as that in the conventional method shown in FIG. 2B. However, the waveform for the triangular wave current is modulated to a steeper shape at the initial points of rising and falling, as shown in the diagram. A ROM is provided in the reference signal generator (control unit) built into the triangular wave generator for modulating the waveform in this way. Hence, the ROM data is modified to generate a prescribed reference signal. An amplifier is used to amplify the reference signal in order to generate a prescribed modulated triangular wave.

Figure 9:
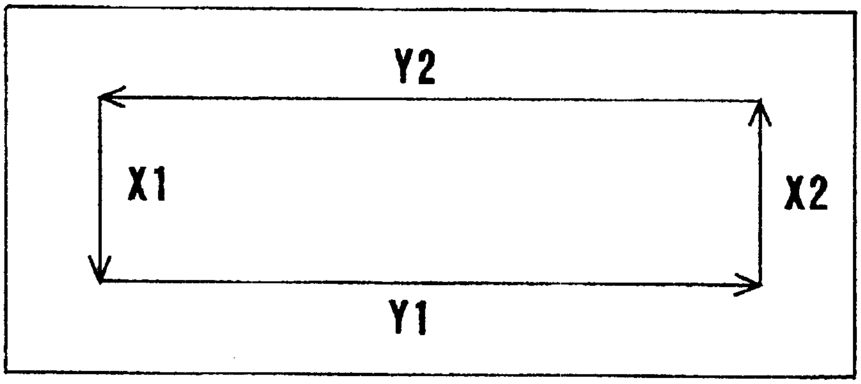
FIG. 9 is a plan view showing the path of the electron beam in the first embodiment.
Figure 10:
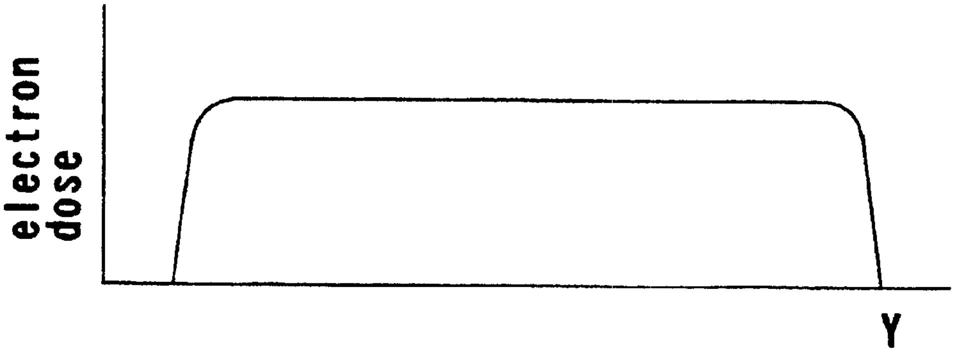
FIG. 10 is a graph showing the dose distribution along the scanning path in the first embodiment.

Further, the point at which the rise of the square wave current and the peak of the triangular wave current synchronize is the same as that in the conventional example. Hence, the path described by the electron beam in the present embodiment also describes a rectangular shape, as shown in FIG. 9. In other words, when the square wave current shifts from −Q to +Q at time T1, the electron beam moves momentarily on the X1 path. Subsequently, when the triangular wave current shifts from +P to −P between times T1 and T2, the square wave current is fixed at +Q. Accordingly, the electron beam moves along the Y1 path during this time. At time T2, the square wave current shifts from +Q to −Q at which time the electron beam moves instantaneously along the X2 path. Subsequently, the triangular wave current moves from −P to +P between times T2 and T3, while the square wave current is remains at −Q. Accordingly, the election beam moves along the Y2 path during this time.

In the present embodiment, the waveform of the triangular wave current is modulated to have a sharp slope in the range from +P to 0, thereby increasing the scanning speed, and to have a gradual slope in the range from 0 to −P, thereby decreasing the scanning speed. More specifically, the waveform includes displacement points A and B along the rising and falling sections, forming connected linear segments. A steep segment connects a peak P on the rise or fall of the current to the point A, followed by a slightly less steep segment between points A and B. The final segment from point B to the next peak P is a gradual slant. With this configuration, the electron beam passes over the portion that is greatly affected by hysteresis in a short time in order to achieve a uniform dose distribution by compensating these effects.

In order to set the level of steepness in the waveform, the displacement points A and B are first set to a likely size. The data for this waveform is written as reference signals to the ROM. The amplifier amplifies the signals to generate a modulated triangular wave, and the dose distribution is measured. If the distribution is not uniform, then settings for a new waveform are written to ROM and the process is repeated.

As shown in FIG. 8, displacement points A and B are set in the range between +P and 0, forming a slope in three sections. The time between +P and 0 is called Tc, while the time between 0 and −P is called Td, where Tc<Td. The dose distribution of the electron beam scanned according to the triangular wave current shown in FIG. 8 is uniform in the lengthwise directions Y1 and Y2 shown in FIG. 10.

In the embodiment described above, an example waveform for a triangular wave current is modulated in connected line segments using two displacement points A and B. However, it is obvious that the number of displacement points can be set to a desired value. Further, curved lines rather than straight lines can be used to connect the points.

Also, the control device for modulating the triangular wave current may provide a triangular current waveform from the triangular wave generator in order that the waveform of the flux density generated by the scanning coil forms a substantially triangular shape. According to the controller, the flux density generated by the scanning coil forms a substantially triangular shape, thus the distribution of the electron beam is uniform at all points in the scanning Y direction.

In the embodiment described above, the electron beam is deflected and scanned along a rectangular path, wherein the distribution of the electron beam is uniform at all points in the scanning direction. Accordingly, degradation of the window foil is reduced and a uniform beam can be irradiated on the target matter.

Figure 11A:
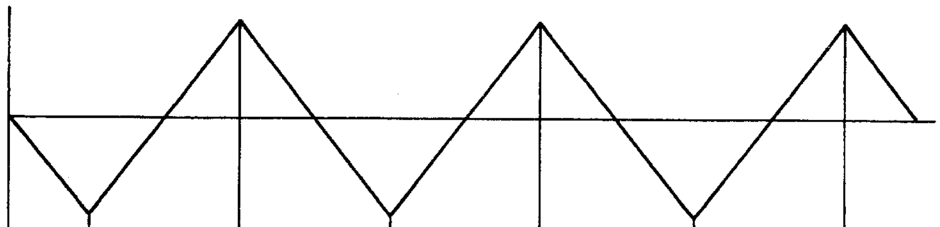
FIGS. 11A and 11B are graphs showing waveforms of a triangular wave current and a trapezoidal wave current, respectively, according to the second embodiment of the present invention.
Figure 11B:
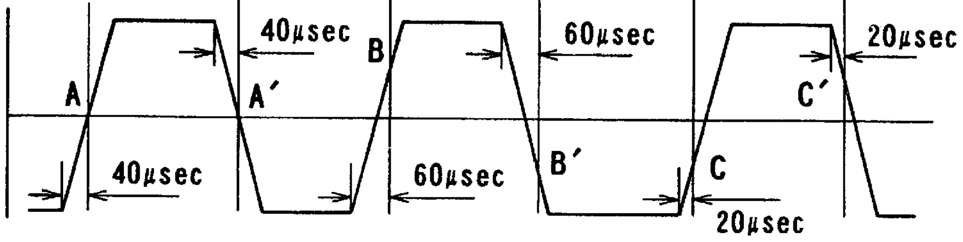
Figure 12:
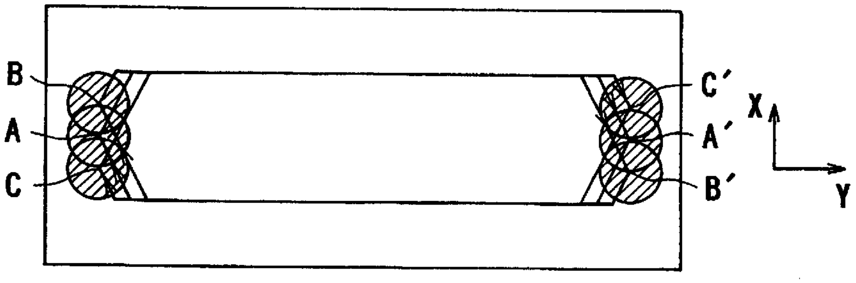
FIG. 12 is a plan view showing the path of the electron beam in the second embodiment.

Next, an electron beam irradiating apparatus according to a second embodiment of the present invention will be described with reference to FIGS. 11 and 12. FIG. 11A shows the waveform of a triangular wave current for scanning in the Y-direction that the triangular wave generator 22 supplies to the scanning coil 17. This waveform is the same as that of the conventional technology shown in FIG. 6A. As shown in FIG. 11B, the present invention changes the rise and fall timing of the trapezoidal (square) current waveform provided to the deflecting coil 16. That is, the square wave generator 21 is provided with a device for controlling the rise and fall timing of the trapezoidal square wave current.

In the prior art described above, the waveform of the trapezoidal wave current is formed such that the peaks of the triangular wave current are synchronized with the midpoints of the rise and fall of the square wave current. In the present embodiment, however, the timing of the rise and fall of the trapezoidal wave current is set to be slightly off the peak times of the triangular wave current.

In the X-direction scan, the rise and fall of the trapezoidal square wave shown in FIG. 11B normally requires 50–100 μsec. By sequentially staggering the timing of these rises and falls of the trapezoidal wave current, it is possible to sequentially distribute the point of reverse movement in the elongated hexagonal path in X direction, as shown in FIG. 12. In other words, the peaks of the triangular wave current signify that the electron beam is positioned on either of both ends in the Y scanning direction. By delaying the synchronized position for the rise of the trapezoidal wave in relation to the midpoint A (such as point B in FIG. 11B), the reverse point can be moved upward in the X-direction. Similarly, by advancing the synchronized position on the rise of the trapezoidal wave in relation to the midpoint A (such as the position C shown in FIG. 11B), the reverse point can be moved downward in the X-direction. The same process can be performed in the fall timing of the trapezoidal wave current to move the reverse point A' to either B' or C'.

The example shown in FIG. 11 assumes that 80 μsec are required for the rise or fall of the trapezoidal wave current. Further, the reverse position is moved among three locations. In the initial trapezoidal wave current, the midpoints of the rise and fall of the current are synchronized with the peaks of the triangular wave current. Accordingly, the triangular wave current reaches its peak 40 μsec after the rise or fall in the trapezoidal wave current. With this waveform, the reversing points are A and A' of FIG. 12. The second trapezoidal wave current is set such that the peak of the triangular wave current requires 60 μsec after the start of the rise and fall of the trapezoidal wave current. The reversing points in this waveform are B and B' shown in FIG. 12. With the third trapezoidal wave current, the triangular wave current reaches its peak 20 μsec after the rise or fall of the trapezoidal wave current. The reversing points in this example are C and C' of FIG. 12.

Hence, the trapezoidal square waveforms in the present embodiment in order between a reference position (0), an advanced position (minus 20 μsec), and a delayed position (plus 20 μsec) in relation to the reference rising position (40 μsec) of the waveform. With this configuration, the first reverse point in FIG. 12 is A, followed by B in the next cycle, C in the next cycle, and then back to A in the subsequent cycle. That is the reversing points alternate in order between A, B, C, A, B, C, . . . . The condition of reversing points A', B', and C' on the right side of FIG. 12 are exactly the same.

In the embodiment described above, the total time of the rise or fall for the trapezoidal wave current is 80 μsec. Therefore, the reference position (midpoint) is 40 μsec. When moving the reverse point upward in the X-direction, the peak of the triangular wave current is synchronized to 60 μsec after the trapezoidal wave current begins to rise. When moving the reverse point downward in the X-direction, the peak of the triangular wave current is synchronized at 20 μsec after the rise of the trapezoidal wave current. Accordingly, the width of movement of the reverse point in FIG. 12 is about half the scanning width in the X-direction. However, it is obvious that this scanning width can be adjusted to a value appropriate to the conditions of heat dissipation.

In the previous embodiment, the reverse position is moved among three locations, but this number can be changed, provided that there is a plurality of reverse positions. The larger the number of reverse positions, the more the electron beam will be distributed.

With the present invention described above, the reverse position of the scanning electron beam is moved at each cycle of the square wave in order to diffuse the heat applied to the window foil. As a result, the life of the window foil can be extended, and the apparatus used to cool the window foil can be made more compact. Further, a more uniformly dense electron beam can be irradiated on the target matter.

INDUSTRIAL APPLICABILITY

The present invention is suitably applied to an electron beam irradiating apparatus, which is used for processing exhaust gas and the like discharged from a thermal power plant, for example, or an electron beam irradiating apparatus for large current irradiation used to improve the quality of such matter as cross-linking resins.

What is claimed is:

1. An apparatus for irradiating an electron beam comprising:

a scanning coil;

a triangular wave generator for providing a triangular wave current to the scanning coil to move the electron beam in a first scanning direction;

a deflecting coil;

a square wave generator for providing a square wave current to the deflecting coil to move the electron beam in a second scanning direction orthogonal to the first scanning direction; and a control unit for modulating the triangular wave current provided from the triangular wave generator for canceling the effects of hysteresis in the scanning coil.

2. An apparatus for irradiating an electron beam as recited in claim 1, wherein the control unit modulates the triangular wave current to form steep slopes on the rise and fall of the waveform.

3. An apparatus for irradiating an electron beam as recited in claim 2, wherein the waveform of the triangular wave current has a plurality of displacement points on both the rise and fall of the waveform to divide the rise and fall into a plurality of connected linear segments.

4. A method of irradiating an electron beam comprising:

generating a triangular wave current using a triangular wave generator;

supplying the triangular wave current to a scanning coil to move the electron beam in a first scanning direction;

generating a square wave current using a square wave generator;

supplying the square wave current to a deflecting coil to move the electron beam in a second scanning direction orthogonal to the first scanning direction; and modulating the triangular wave current provided from the triangular wave generator using a control unit to cancel the effects of hysteresis in the scanning coil.

5. A method of irradiating an electron beam as recited in claim 4, wherein the triangular wave current is modulated to form steep slopes on the rise and fall of the waveform.

6. A method of irradiating an electron beam comprising:

generating a triangular wave current using a triangular wave generator;

supplying the triangular wave current to a scanning coil to move the electron beam in a first scanning direction;

generating a square wave current using a square wave generator;

supplying the square wave current to a deflecting coil to move the electron beam in a second scanning direction orthogonal to the first scanning direction; and synchronizing the rise of the square wave current to be shifted a prescribed interval in relation to the peak values of the triangular wave current in order to distribute the reversing points on the electron beam path along the second scanning direction.

7. A method of irradiating an electron beam as recited in claim 6, wherein the timing of the rise in the square wave current is shifted each cycle to repeatedly alternate the position on the square wave in relation to a reference rising position in the order of a reference position, a delayed position, an advanced position, the reference position, the delayed position and so on.

8. A method of irradiating an electron beam as recited in claim 6, wherein the reversing point in the electron beam path is moved in the prescribed order within about half the scanning width formed by the square wave current.

9. An apparatus for irradiating an electron beam comprising:

a scanning coil;

a triangular wave generator for providing a triangular wave current to the scanning coil to move the electron beam in a first scanning direction;

a deflecting coil;

a square wave generator for providing a square wave current to the deflecting coil to move the electron beam in a second scanning direction orthogonal to the first scanning direction; and a control device for synchronizing the rise of the square wave current to be shifted a prescribed time interval in relation to the peak values of the triangular wave current to distribute reversing points on the electron beam path in a prescribed order along the second scanning direction.

10. An apparatus for irradiating an electron beam comprising:

a scanning coil;

a triangular wave generator for providing a triangular wave current to the scanning coil to move the electron beam in a first scanning direction;

a deflecting coil;

a square wave generator for providing a square wave current to the deflecting coil to move the electron beam in a second scanning direction orthogonal to the first scanning direction; and a control device for modulating the triangular wave current provided from the triangular wave generator in order that the waveform of the flux density generated by the scanning coil forms a substantially triangular shape.

* * * * *